(12) United States Patent
Pracht et al.

(10) Patent No.: US 7,443,055 B2
(45) Date of Patent: Oct. 28, 2008

(54) SYSTEMS AND METHODS FOR PROVIDING REDUNDANT VOLTAGE REGULATION

(75) Inventors: Kelly Jean Pracht, Fort collins, CO (US); Jack Lavier, Fort Collins, CO (US); Samuel M. Babb, Fort Collins, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 115 days.

(21) Appl. No.: 11/585,545

(22) Filed: Oct. 24, 2006

(65) Prior Publication Data

US 2008/0093933 A1 Apr. 24, 2008

(51) Int. Cl.
*H02J 1/00* (2006.01)
*H02J 3/00* (2006.01)

(52) U.S. Cl. .............................. 307/82; 307/58; 307/64; 307/116

(58) Field of Classification Search ................ 307/116, 307/82, 58, 64; 361/18
See application file for complete search history.

(56) References Cited

U.S. PATENT DOCUMENTS

| | | | |
|---|---|---|---|
| 6,275,958 B1 * | 8/2001 | Carpenter et al. ............. 714/48 |
| 6,449,676 B1 * | 9/2002 | Johari et al. ................. 710/304 |
| 6,614,133 B2 * | 9/2003 | Belson et al. ................. 307/58 |
| 6,865,682 B1 | 3/2005 | Talbot et al. | |
| 6,911,809 B2 | 6/2005 | Kernahan | |
| 6,912,139 B2 | 6/2005 | Kernahan et al. | |
| 6,946,753 B2 | 9/2005 | Kerhahan et al. | |
| 6,965,220 B2 | 11/2005 | Kerhahan et al. | |
| 6,975,525 B2 | 12/2005 | Kernahan | |
| 7,002,328 B2 | 2/2006 | Kernahan et al. | |
| 7,019,506 B2 | 3/2006 | Kernahan | |

\* cited by examiner

*Primary Examiner*—Michael J Sherry
*Assistant Examiner*—Carlos Amaya

(57) ABSTRACT

Systems and methods for providing redundant voltage regulation are provided. A representative method incorporates: providing a first voltage regulator and a second voltage regulator, the second voltage regulator having output rectifiers; electrically connecting the first voltage regulator to a load such that the first voltage regulator independently powers the load; disabling the output rectifiers of the second voltage regulator; detecting a fault of the first voltage regulator; responsive to the fault, enabling the output rectifiers of the second voltage regulator such that the second voltage regulator independently powers the load.

20 Claims, 4 Drawing Sheets

SYSTEMS AND METHODS FOR PROVIDING REDUNDANT VOLTAGE REGULATION

DESCRIPTION OF THE RELATED ART

A DC-DC converter is a voltage regulator that converts one direct current voltage to another direct current voltage. Notably, there are numerous DC-DC converters present in computing systems. For example, a single circuit board in a computing system can use as many as 15-30 different voltages for powering various subsystems, with each of these voltages being produced by a separate DC-DC converter.

In this regard, it is oftentimes desirable to provide redundant power sources in systems, such as computing systems. Redundancy tends to ensure that, if one power source fails, another source is able to provide the requisite power for various loads within the system.

One technique for providing power redundancy involves the use of paralleled DC-DC converters. Oftentimes, this technique implements a form of current share between the paralleled converters, each of which is designed to carry a portion of a load during normal operation. There may be any number of paralleled converters, of which it is desired that each carry an equal portion (within allotted tolerances) of the load. During normal operation, the paralleled converters are "ON" and are providing power to the load. Responsive to a failure of one of the converters, the failed converter is electrically disconnected from the circuit, leaving the remaining converter to carry the entire load.

Some of the perceived challenges to the aforementioned technique include: the behavior of the converters during no load conditions; achieving accurate current share during startup as well as during transient load conditions; reliability and speed of fault detection and responsive disconnect of a failed converter; and the requirement that converters be of the same topology so that current share is reasonably achievable. One significant impact of inaccurate current share between paralleled converters is the potential for at least one of the paralleled converters to sink current while at least one of the other paralleled converters supply that current. This can lead to catastrophic failures of the converter(s) sinking current. The converter(s) providing that current may be overstressed, hence reducing their life expectancy and reducing the value of the redundancy. Furthermore, this can also lead to increased power draws, lower efficiency, hotter components, shutting off of power due to over-current protection and/or other undesirable affects.

SUMMARY

In this regard, systems and methods for providing redundant voltage regulation are provided. An exemplary embodiment of such a system comprises a first voltage regulator, a second voltage regulator and a fault detector. The first voltage regulator is operative to power a load. The second voltage regulator is operative to power the load, with the second voltage regulator having output rectifiers. In a first mode of operation, the output rectifiers are disabled such that the second voltage regulator does not provide power to the load. The fault detector is operative to detect a fault of the first voltage regulator such that, in the first mode of operation, the fault detector enables the first voltage regulator to power the load independent of the second voltage regulator and, in a second mode of operation responsive to a detected fault of the first voltage regulator, the fault detector enables the output rectifiers of the second voltage regulator such that the second voltage regulator powers the load independent of the first voltage regulator.

Another embodiment of such a system comprises a circuit board, a first voltage regulator module and a fault detector. The circuit board has an embedded voltage regulator and lacks a component, located electrically downstream of the embedded voltage regulator, for disconnecting the embedded voltage regulator from a load. The first voltage regulator module has a first voltage regulator and a first output disconnect, with the first voltage regulator module being removably attachable to the circuit board such that attachment of the first voltage regulator module to the circuit board enables electrical connection of the first voltage regulator to the load. When so attached, the first output disconnect is operative to selectively, electrically connect and disconnect the first voltage regulator from the load. The fault detector is operative to detect a fault of the first voltage regulator such that, when the first voltage regulator module is attached to the circuit board and in a first mode of operation, the fault detector enables the first voltage regulator to power the load independent of the embedded voltage regulator and, when the first voltage regulator module is attached to the circuit board and in a second mode of operation responsive to a detected fault of the first voltage regulator, the fault detector enables the first output disconnect to electrically disconnect the first voltage regulator from the load and enables the embedded voltage regulator to power the load independent of the first voltage regulator such that redundant voltage regulation is provided.

An embodiment of a method for providing redundant voltage regulation comprises: providing a first voltage regulator and a second voltage regulator, the second voltage regulator having drive circuitry; electrically connecting the first voltage regulator to a load such that the first voltage regulator independently powers the load; disabling the drive circuitry of the second voltage regulator; detecting a fault of the first voltage regulator; and, responsive to the fault, enabling the drive circuitry of the second voltage regulator such that the second voltage regulator independently powers the load.

Other systems, methods, features and/or advantages of the present invention will be or become apparent to one with skill in the art upon examination of the following drawings and detailed description. It is intended that all such additional systems, methods, features and/or advantages be included within this description and protected by the accompanying claims.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

As will be described in detail here, systems and methods for providing redundant voltage regulation are provided. In particular, some embodiments provide redundant voltage regulation without using current sharing circuits, which are used to balance loads from multiple voltage regulators, and which tend to be problematic in their implementation. Specifically, several exemplary embodiments implementing a technique referred to herein as "warm standby" will be described.

Figure 1:
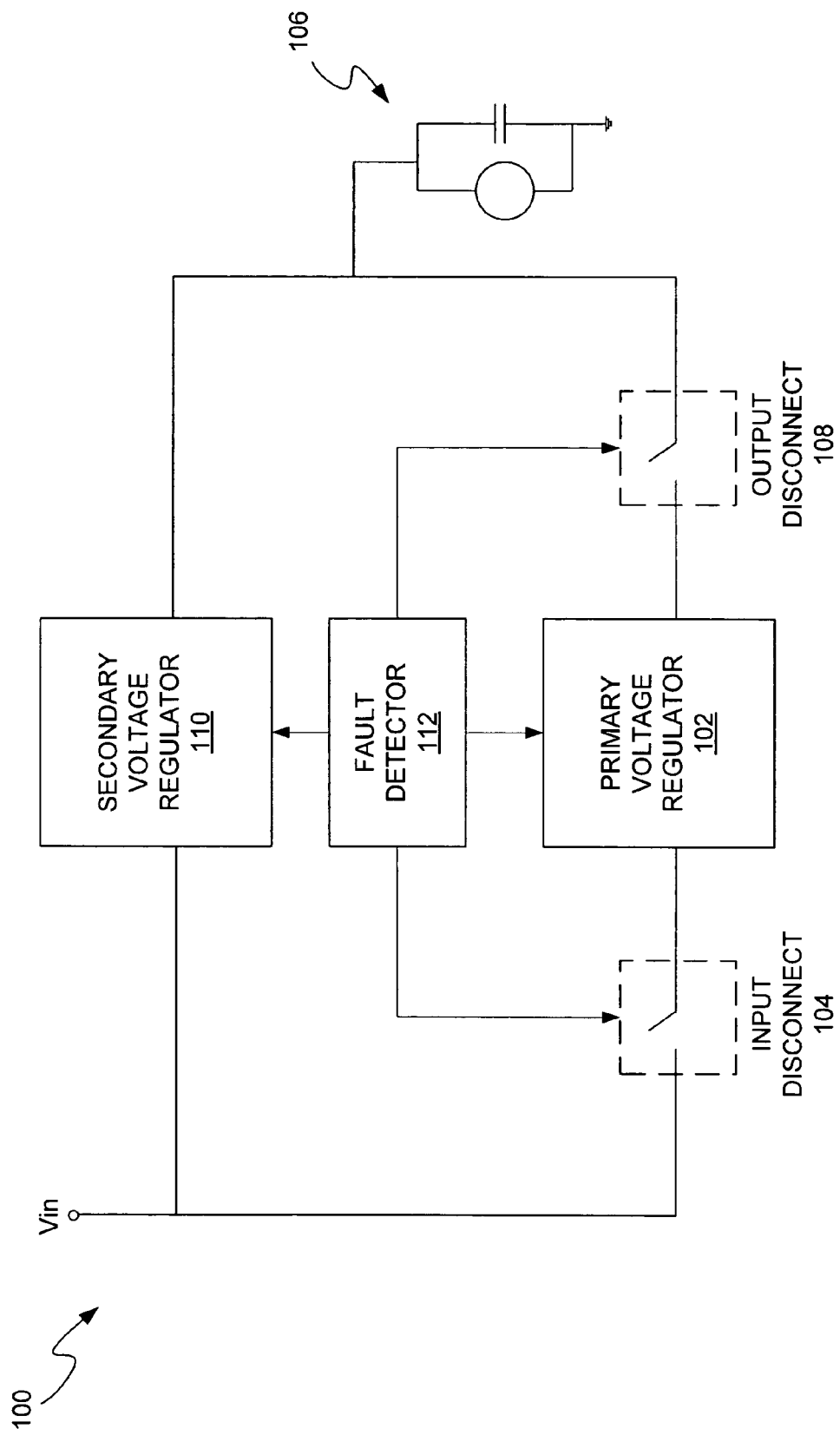
FIG. 1 is a schematic diagram illustrating an exemplary embodiment of a system for providing redundant voltage regulation.

In this regard, FIG. 1 is a schematic diagram illustrating an exemplary embodiment of a system 100 for providing redundant voltage regulation. As shown in FIG. 1, system 100 incorporates a primary voltage regulator 102 that is selectively, electrically connected to a voltage source (Vin) via an input disconnect 104 and to a load 106 via an output disconnect 108. A secondary voltage regulator 110 also is provided that is electrically connected between Vin and the load. Notably, an additional component for performing electrical disconnect is not provided between the secondary voltage regulator and the load. In this regard, output rectifiers of the secondary voltage regulator can be held 'OFF', thereby providing a disconnect that is inherent to the design without additional circuitry.

Each of the primary and secondary voltage regulators is able to power the entire load 106; however, under normal conditions, the primary voltage regulator alone provides such power.

Also shown in FIG. 1 is a fault detector 112 that communicates with the primary voltage regulator 102 and the secondary voltage regulator 110. The fault detector monitors the primary voltage regulator for one or more of various failures, such as a catastrophic failure of the power train synchronous rectifiers, for example. Responsive to detecting such a failure, the fault detector electrically disconnects the primary voltage regulator from the load by causing the input and output disconnects to open. The fault detector also causes the secondary voltage regulator to power the load by no longer holding the output rectifiers in an OFF state and allowing the output rectifiers to begin switching.

Notably, when the primary voltage regulator is carrying the load, the secondary voltage regulator is operating in warm standby. This is in contrast to conventional hot standby, in which a secondary voltage regulator is electrically disconnected from a load but is providing an output that could be used for carrying the load. In warm standby, initial conditions of the secondary voltage regulator may be set. The initial conditions that might be set include, but are not limited to: biasing the control loop error amplifiers to avoid long slew rates at first startup; setting initial conditions on the output inductors such that the current can be ramped quickly, as well as communicating information from the first voltage regulator regarding output current and voltage such that the second voltage regulator will be set at the correct starting point. However, while the first regulator is providing the power, the secondary voltage regulator is not providing power and, thus, additional components for electrically disconnecting the secondary voltage regulator need not be used. This is achieved by using the output rectifiers (already present in the topology) as the disconnect for the time the secondary voltage regulator is not providing power to the load. This potentially results in a cost and space benefit compared to the aforementioned hot standby technique because these additional components can be omitted.

In some embodiments (see FIG. 2), the secondary voltage regulator can be implemented as a built-in or embedded voltage regulator of a circuit board that carries the load when redundancy is not provided. Additionally, the primary voltage regulator can be provided as part of a removably attachable module that can be electrically connected with the circuit board when redundancy is desired. However, when the primary voltage regulator is electrically connected, the primary voltage regulator operates as the default voltage regulator for independently carrying the load. Thus, when redundancy is provided, the secondary voltage regulator can operate in warm standby until a fault is detected.

Notably, one or more perceived advantages may be provided by an embodiment such as described above. By way of example, by using an embedded voltage regulator, manufacturing costs can be reduced, as such implementations tend to incur relatively low material costs. As another example, by incorporating voltage regulation redundancy in a module, such redundancy and the costs associated therewith are provided as an option to a customer. That is, if redundancy is not desired, the feature can be omitted and costs associated with the redundant feature can be avoided by the customer. Additionally, by using the voltage regulator of the module as the default voltage regulator when installed, the voltage regulator of the module may tend to fail before the embedded voltage regulator fails. If this occurs, the module can be removed and replaced so that redundancy once again can be provided. Thus, the board that incorporates the embedded voltage regulator need not be replaced in order to provide redundancy.

Additionally, since only one or the other of the voltage regulators is providing power to the load at any given time, except potentially during a transient period during which the load is being transferred, the voltage regulators can be disparate types.

During standard current share topologies, the voltage regulators are the same type so that accurate and reliable current share can be achieved. This architecture does not require the regulators to share current, hence this restraint is removed.

Figure 2:
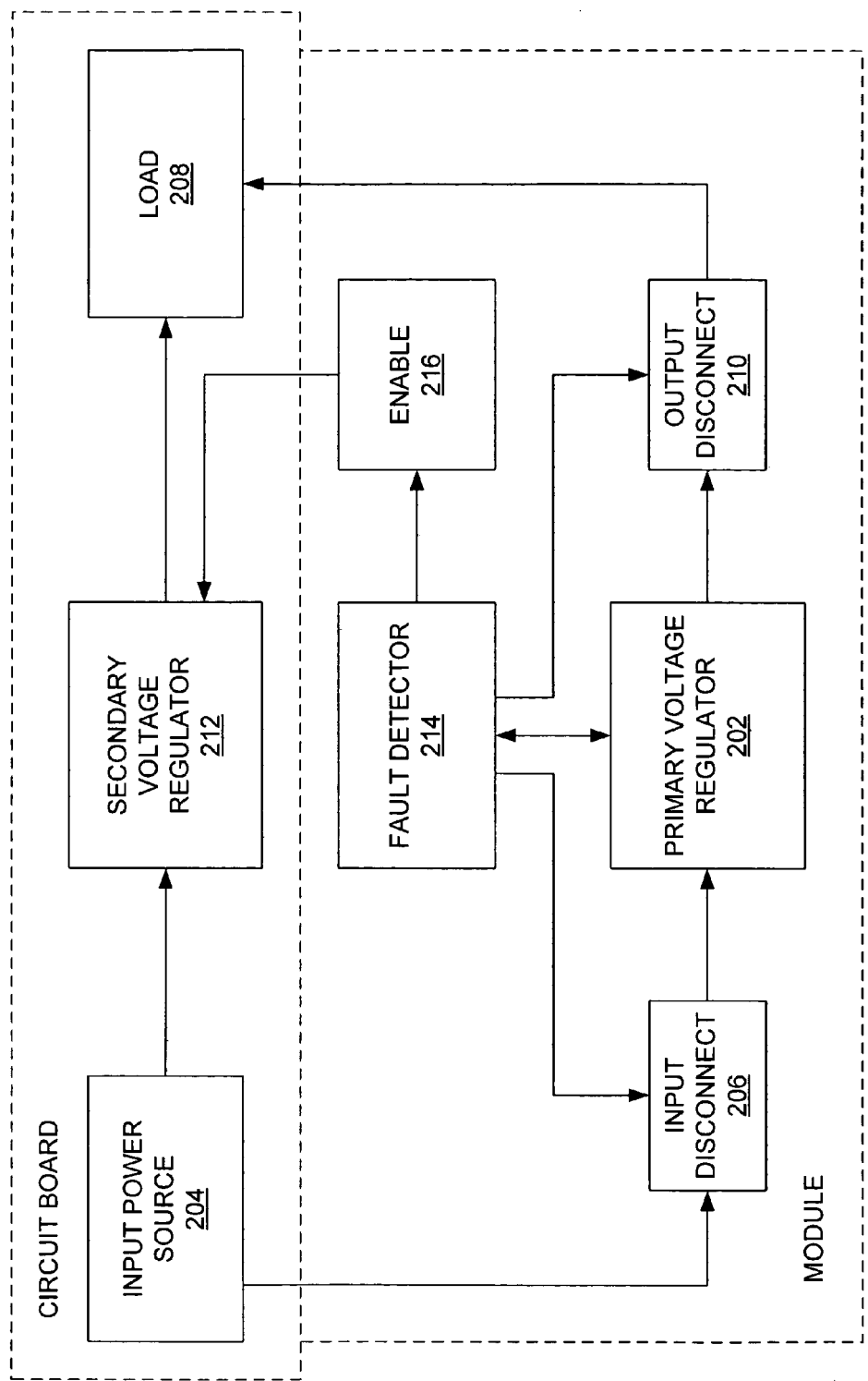
FIG. 2 is a schematic diagram illustrating another exemplary embodiment of a system for providing redundant voltage regulation.

FIG. 2 is a schematic diagram illustrating another exemplary embodiment of a system for providing redundant voltage regulation. As shown in FIG. 2, system 200 incorporates a primary voltage regulator 202 that is selectively, electrically connected to an input power source 204 via an input disconnect 206. The primary voltage regulator also is selectively, electrically connected to a load 208 via an output disconnect 210. A secondary voltage regulator 212 also is provided that is electrically connected between the input power source and the load. Additionally, a fault detector 214 communicates with the primary voltage regulator 202 and the secondary voltage regulator 212. The fault detector also communicates with enable circuitry 216, which will be described in greater detail later.

The fault detector monitors the primary voltage regulator for one or more of various failures. Responsive to detecting such a failure, the fault detector electrically disconnects the primary voltage regulator from the load by actuating the input and output disconnects. The fault detector also causes the secondary voltage regulator to power the load. Notably, each of the primary and secondary voltage regulators is able to power the entire load. It should also be noted that although this embodiment incorporates the use of a shared input power source, non-shared power sources could be used.

In operation, three general modes of operation are accommodated. Specifically, the first mode is a redundant mode, the second mode is a fault mode, and the third mode is a non-redundant mode. In the redundant mode, the primary voltage regulator is 'ON' and supplying 100% of the load. In this mode, the secondary voltage regulator does not provide power to the load and is considered in warm standby or 'SEMI-OFF.' As will be described in greater detail later, sensing circuitry and pulse width modulation (PWM) signals of the secondary voltage regulator are active in this mode.

The sensing circuitry could be used in configurations in which accurately biasing the second voltage regulator is desired. This option could include providing voltage and current information from the first voltage regulator (Primary) such that the initial conditions of the second voltage regulator (Standby) are reasonably accurate. This may allow the second voltage regulator to respond faster to the load when a fault occurs.

In the fault mode, in which a fault of the primary voltage regulator has been detected, the primary voltage regulator is disconnected from the input power source and from the load, using the input disconnect and the output disconnect, respectively. Additionally, the secondary voltage regulator transitions to 'ON.'

In the non-redundant mode, disconnect of the primary voltage regulator has been completed and the secondary voltage regulator is supplying 100% of the load.

Transitioning from the redundant mode to the fault mode, and then ultimately to the non-redundant mode, is facilitated in large part by the fault detector. The fault detector is responsible for detecting faults and for indicating the presence of any faults to other components. By way of example, in an embodiment of a system for providing redundant voltage regulation implemented as a multi-phase buck controller (an example of which will be described in greater detail in the embodiment of FIG. 3), some of the most common faults that can occur are the switching FETs failing short and driver failure. Although there are other faults that can cause problems in providing regulated power to a load in such an implementation (e.g., controller failure, miscellaneous part failure and board failure), detection of faults with the switching FETs and the drivers can be more critical since these faults can occur more often.

Responsive to fault detection, the fault detector provides a fault signal to the output disconnect so that the primary voltage regulator can be electrically disconnected from the load. In some embodiments, the output disconnect is implemented as a series connected MOSFET that is actuated by the fault signal from the fault detector. Clearly, such an implementation is much less complex than traditional active OR-ing circuits that tend to be used in conventional redundant power implementations.

Although not required in all embodiments, an input disconnect is used in the embodiment of FIG. 2 to disconnect the primary voltage regulator from the input power source responsive to the fault detector detecting a fault. Such an input disconnect can potentially prevent supply turn off, which may be initiated by a self-protection scheme that is designed to trigger responsive to voltage sag. Notably, voltage sag can be caused by destructive failure of the primary voltage regulator, for example.

As with the output disconnect, various configurations of input disconnects can be used. By way of example, a series MOSFET can be used. Such a series MOSFET may be in the form of a hot-swap controller, an inrush protection circuit or a series MOSFET controlled by the fault signal described earlier.

Also responsive to fault detection, the fault detector provides an enable control signal for enabling the secondary voltage regulator to provide power to the load. In those embodiments in which the secondary voltage regulator incorporates switching FETs, these FETs can be turned 'OFF' or otherwise disabled until the secondary voltage regulator receives the enable control signal. Responsive to that signal, the switching FETs can start switching, thereby allowing power to be provided from the secondary voltage regulator to the load. It should be noted that, in some embodiments, the fault detector can provide an enable control signal directly to the secondary voltage regulator. However, in the embodiment of FIG. 2, the enable control signal is provided to enable circuitry 216, which generates an appropriately configured enable signal for actuating the secondary voltage regulator.

Figure 3:
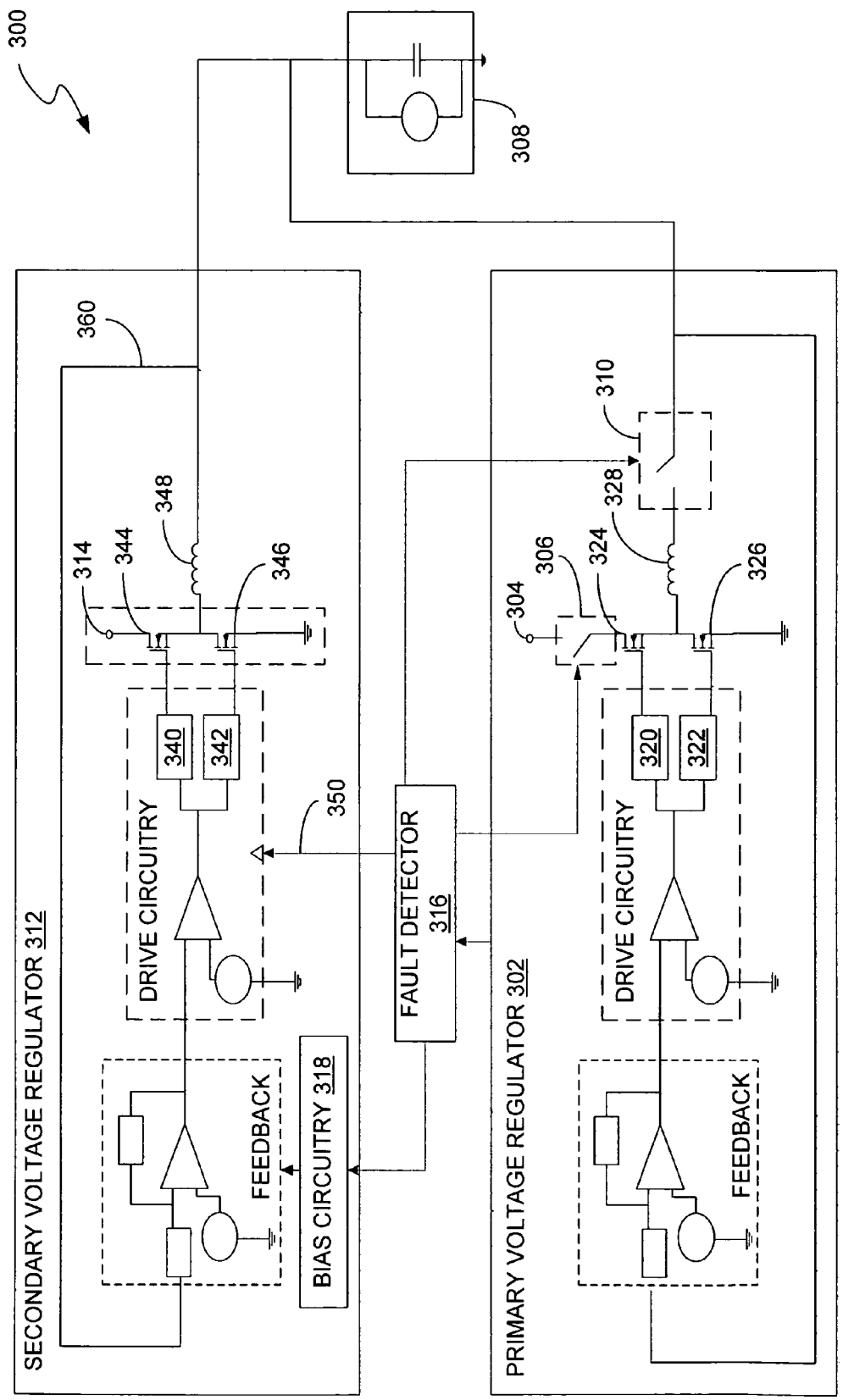
FIG. 3 is a schematic diagram illustrating another exemplary embodiment of a system for providing redundant voltage regulation.

FIG. 3 is a schematic diagram illustrating another exemplary embodiment of a system for providing redundant voltage regulation. In particular, a single-phase buck controller is depicted, although this may also be implemented as a multi-phase buck controller by increasing the number of phases. As shown in FIG. 3, system 300 incorporates a primary voltage regulator 302 that is selectively, electrically connected to an input power source 304 via an input disconnect 306. The primary voltage regulator also is selectively, electrically connected to a load 308 via an output disconnect 310. A secondary voltage regulator 312 also is provided that is electrically connected between an input power source 314 and the load. Additionally, a fault detector 316 communicates with the primary voltage regulator and the secondary voltage regulator. The fault detector also communicates with bias circuitry 318, which will be described in greater detail later.

As shown in FIG. 3, the primary voltage regulator incorporates drive circuitry that includes various components. Of particular interest, however, are drivers 320 and 322. Notably, driver 320 provides a first drive signal to a high gate FET 324, and the driver 322 provides a second drive signal (inverse to that of the first drive signal) to a low gate FET 326. This generates a pulse width modulated (PWM) signal at the location in which 324, 328 and 326 are connected. This PWM signal is then averaged by the inductor 328 and output capacitors 308. The primary voltage regulator in this embodiment also incorporates feedback components to promote improved voltage, current and impedance regulation characteristics as is known to one of skill in the art.

The secondary voltage regulator also incorporates a similar although not necessarily identical topology. Of particular interest, however, are drivers 340 and 342. Notably, driver 340 provides a first drive signal to a high gate FET 344, and the driver 342 provides a second drive signal (inverse to that of the first drive signal) to a low gate FET 346. In operation in the redundant mode, this secondary voltage regulator is disconnected from the load. An enable signal is provided from the fault detector 316 to the 'drive circuitry'. The output FETs 344 and 346 will not switch or produce a PWM signal to the inductor 348 during this time. Instead the output FETs will be at high impedance such that the sources of the output FETs will be essentially electrically isolated from the load 308. The FETs 344 and 346 are then operating as OR-ing circuitry while the secondary voltage regulator is not producing power to the load.

In operation in the fault mode and the non-redundant mode, the drive circuitry will be enabled such that the high and low gate FETs begin switching and allowing regulated power to be provided from the secondary voltage regulator to the load. The secondary voltage regulator in this embodiment also incorporates feedback components to promote improved voltage, current and impedance regulation characteristics as is known to one of skill in the art.

Responsive to fault detection, the fault detector provides a fault signal to the output disconnect so that the primary voltage regulator can be electrically disconnected from the load and to the input disconnect so that the primary voltage regulator can be electrically disconnected from input power source 304.

Also responsive to fault detection, the fault detector provides an enable control signal 350 for enabling the secondary voltage regulator to provide power to the load. In this embodiment, the enable control signal activates the drivers 340 and 342 so that the high and low gate FETs 344, 346 can begin switching. By keeping the FETs 344 and 346 OFF despite the presence of feedback and having the other secondary voltage regulator components active, this suppresses the PWM signal to be present at the phase node (the physical connection between the FETs 344, 346) and the output inductor 348. This is referred to as PWM suppression.

The fault detector also provides a bias control signal to bias circuitry 318 responsive to fault detection. The bias circuitry involves setting of the initial conditions of the secondary voltage regulator. Notably, there is a time delay between the time that the secondary voltage regulator is enabled and the time that a properly regulated output voltage is likely to be achieved. In this regard, until the switching FETs of the secondary voltage regulator begin switching and regulated voltage is provided to the load, the feedback signal 360 can be erroneous. Thus, the feedback components of any control elements might be biased to a nominal value so that a suitable a PWM signal can be provided to the switching FETs. It also may be desired to lengthen the first PWM signals to the inductor 348 such that current can ramp more quickly to the load. There also may be some communication from the primary voltage regulator to the secondary voltage regulator communicating desired output voltage and output current. The bias circuitry is used to provide the aforementioned nominal value to the feedback components until the system is operating in the non-redundant mode, in which the secondary voltage regulator is independently powering the load. In some embodiments, this is accomplished by holding the feedback elements in a known state until the system transitions to the non-redundant mode. After this transition, the bias circuitry can remove the initial condition settings.

As mentioned above, the bias circuitry of the embodiment of FIG. 3 also sets the initial conditions for the secondary voltage regulator. In this regard, when a secondary voltage regulator is first turned 'ON,' there is an inherent time delay caused by the current ramping through the inductor 348. The time delay may be shortened if the PWM signal is started at a higher duty cycle than required for the steady state condition. There are various techniques that can be used for generating a higher duty cycle than that required for steady state. By way of example, this might include setting initial conditions on the PWM controller specific to a design such that the PWM duty cycle is wider than it would be in steady state conditions.

Figure 4:
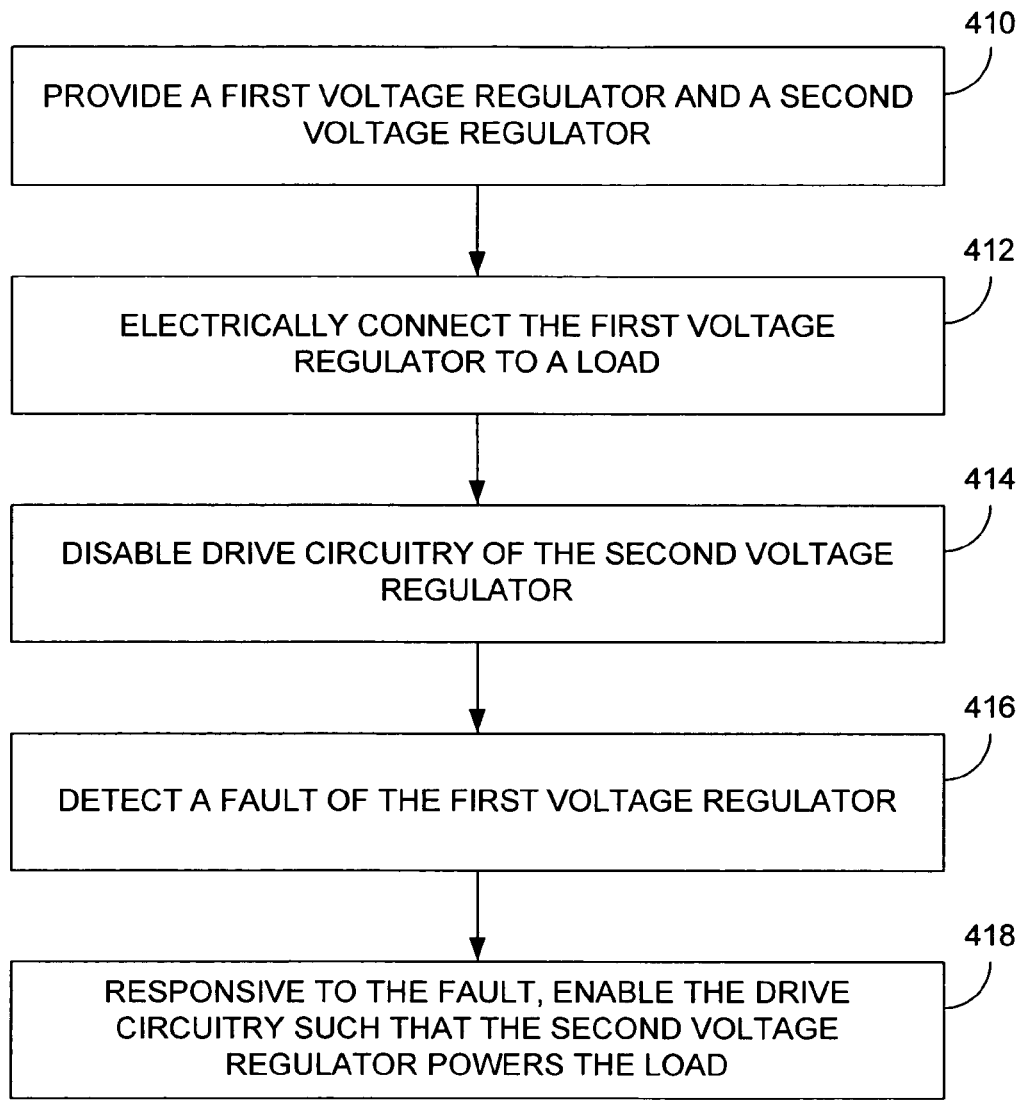
FIG. 4 is a flowchart illustrating an exemplary embodiment of a method for providing redundant voltage regulation.

FIG. 4 is a flowchart illustrating an exemplary embodiment of a method for providing redundant voltage regulation. As shown in FIG. 4, the method may be construed as beginning at block 410, in which a first voltage regulator and a second voltage regulator are provided. Notably, the second voltage regulator incorporates output rectifiers. In block 412, the first voltage regulator is electrically connected to a load such that the first voltage regulator independently powers the load. In block 414, the output rectifiers of the second voltage regulator are disabled. Thereafter, such as depicted in block 416, a fault of the first voltage regulator is detected. Responsive to the fault, such as depicted in block 418, the output rectifiers of the second voltage regulator are enabled such that the second voltage regulator independently powers the load.

It should be emphasized that the above-described embodiments are merely possible examples of implementations. Many variations and modifications may be made to the above-described embodiments. All such modifications and variations are intended to be included herein within the scope of this disclosure.

The invention claimed is:

1. A system for providing redundant voltage regulation comprising:
    a first voltage regulator operative to power a load;
    a second voltage regulator operative to power the load, the second voltage regulator having output rectifiers, wherein, in a first mode of operation, the first voltage regulator communicates information to the second voltage regulator to set initial operating conditions of the second voltage regulator and the output rectifiers are disabled such that the second voltage regulator does not provide power to the load; and
    a fault detector operative to detect a fault of the first voltage regulator such that:
    in the first mode of operation, the fault detector enables the first voltage regulator to power the load independent of the second voltage regulator;
    in a second, transient, mode of operation responsive to a detected fault of the first voltage regulator, the fault detector enables the output rectifiers of the second voltage regulator such that the second voltage regulator and the first voltage regulator provide power to the load simultaneously; and
    in a third mode of operation responsive to a detected fault of the first voltage regulator, the fault detector enables electrical disconnection of the first voltage regulator such that the second voltage regulator powers the load independent of the first voltage regulator.

2. The system of claim 1, further comprising a first output disconnect operative to selectively, electrically connect and disconnect the first voltage regulator from the load; and
    wherein, in the third mode of operation, the fault detector causes the first output disconnect to electrically disconnect the first voltage regulator from the load.

3. The system of claim 2, wherein the first output disconnect is a MOSFET.

4. The system of claim 1, further comprising:
    drive circuitry operative to selectively enable and disable the output rectifiers; and
    bias circuitry electrically connected between the fault detector and the second voltage regulator, the bias circuitry being operative to suppress a pulse width modulation signal of the drive circuitry.

5. The system of claim 1, further comprising:
    drive circuitry operative to selectively enable and disable the output rectifiers; and
    means for suppressing a pulse width modulation signal of the drive circuitry.

6. The system of claim 1, wherein a topology of the first voltage regulator is different than a topology of the second voltage regulator.

7. The system of claim 1, further comprising an input power source operative to provide power to both the first voltage regulator and to the second voltage regulator.

8. The system of claim 7, further comprising a first input disconnect operative to selectively, electrically connect and disconnect the first voltage regulator from the input power source; and
    wherein, in the third mode of operation, the fault detector causes the first input disconnect to electrically disconnect the first voltage regulator from the input power source.

9. The system of claim 8, wherein the first input disconnect is a MOSFET.

10. The system of claim 1, wherein second voltage regulator comprises a first driver and a second driver, and the fault detector enables the output rectifiers of the second voltage regulator by enabling the first driver and the second driver.

11. The system of claim 10, wherein:
the second voltage regulator further comprises a pair of FETs configured as a high gate FET and a low gate FET of an OR-ing circuit;
an output of the first driver is provided as an enable signal for the high gate FET and an output of the second driver is provided as an enable signal of the low gate FET; and
the output of the second driver is the inverse of the output of the first driver.

12. The system of claim 1, further comprising a circuit board, wherein the second voltage regulator is implemented as an embedded voltage regulator of the circuit board, the circuit board lacking a component, located electrically downstream of the second voltage regulator, for disconnecting the second voltage regulator from the load.

13. The system of claim 12, further comprising a voltage regulator module removably attachable to the circuit board, wherein the first voltage regulator is implemented on the voltage regulator module such that attachment of the first voltage regulator module to the circuit board enables electrical connection of the first voltage regulator to the load.

14. A system for providing redundant voltage regulation comprising:
a circuit board having an embedded voltage regulator, the circuit board lacking a component, located electrically downstream of the embedded voltage regulator, for disconnecting the embedded voltage regulator from a load; and
a first voltage regulator module having a first voltage regulator and a first output disconnect, the first voltage regulator module being removably attachable to the circuit board such that attachment of the first voltage regulator module to the circuit board enables electrical connection of the first voltage regulator to the load, wherein, when so attached, the first output disconnect is operative to selectively, electrically connect and disconnect the first voltage regulator from the load; and
a fault detector operative to detect a fault of the first voltage regulator such that:
when the first voltage regulator module is attached to the circuit board and in a first mode of operation, the fault detector enables the first voltage regulator to power the load independent of the embedded voltage regulator,
when the first voltage regulator module is attached to the circuit board and in a second mode of operation responsive to a detected fault of the first voltage regulator, the first voltage regulator module and the embedded voltage regulator provide power to the load simultaneously during a transient period, and
when the first voltage regulator module is attached to the circuit board and in a third mode of operation responsive to a detected fault of the first voltage regulator, the fault detector enables the first output disconnect to electrically disconnect the first voltage regulator from the load and enables the embedded voltage regulator to power the load independent of the first voltage regulator.

15. The system of claim 14, further comprising a second voltage regulator module, the second voltage regulator module having a second voltage regulator and a second output disconnect, the second voltage regulator module being removably attachable to the circuit board such that attachment of the second voltage regulator module to the circuit board enables electrical connection of the second voltage regulator to the load.

16. The system of claim 15, wherein the second voltage regulator module is configured as a replacement for the first voltage regulator module such that the second voltage regulator module is attached to the circuit board only if the first voltage regulator module is not attached to the circuit board.

17. The system of claim 14, wherein the first voltage regulator module further comprises a first input disconnect operative to selectively, electrically connect and disconnect the first voltage regulator from an input power source.

18. The system of claim 14, wherein the first voltage regulator is operative to communicate information corresponding to output current and voltage to the second voltage regulator such that initial conditions of the second voltage regulator are set prior to the second voltage regulator powering the load.

19. A method for providing redundant voltage regulation comprising:
providing a first voltage regulator and a second voltage regulator, the second voltage regulator having output rectifiers;
electrically connecting the first voltage regulator to a load such that the first voltage regulator independently powers the load;
operating the second voltage regulator in a warm standby mode in which initial conditions of the second voltage regulator are set using information communicated from the first voltage regulator while the output rectifiers of the second voltage regulator are disabled;
detecting a fault of the first voltage regulator;
responsive to the fault, enabling the output rectifiers of the second voltage regulator such that the second voltage regulator and the first voltage regulator provide power to the load during a transient period; and
thereafter, independently powering the load using the second voltage regulator.

20. The method of claim 19, wherein responsive to the fault and after the output rectifiers are enabled, the first voltage regulator is electrically disconnected from the load.

* * * * *